United States Patent [19]

Nishizawa et al.

[11] Patent Number: 4,475,131
[45] Date of Patent: Oct. 2, 1984

[54] IMAGE STORAGE DEVICE

[75] Inventors: Jun-ichi Nishizawa, Sendai; Masahiro Konishi, Minami-ashigara; Ikuo Fujimura, Tokyo; Koji Shimanuki, Minami-ashigara, all of Japan

[73] Assignee: Fuji Photo Film Co., Ltd., Japan

[21] Appl. No.: 326,881

[22] Filed: Dec. 2, 1981

[30] Foreign Application Priority Data

Dec. 5, 1980 [JP] Japan ................................ 55-171902

[51] Int. Cl.³ ............................................. H04N 5/76
[52] U.S. Cl. .................................... 358/335; 358/906; 360/9.1; 360/33.1
[58] Field of Search ............... 358/213, 310, 335, 906; 360/8, 9.1, 33.1

[56] References Cited

U.S. PATENT DOCUMENTS 3,922,715 11/1975 Hirashima ............................ 360/9.1
4,163,256 7/1979 Adcock ........................... 358/906 X
4,262,301 4/1981 Erlichman ....................... 358/906 x Primary Examiner—Robert L. Richardson
Attorney, Agent, or Firm—McGlew and Tuttle

[57] ABSTRACT

An image storage device in which stored information read out from each non-destructive readout picture element cell of a photoelectric converter is applied at a first scanning speed to a visual display unit to produce a visible image and the information is also supplied at a lower second scanning speed to a recorder. Switching or branching means is provided for applying the information from the photoelectric converter to the visual display unit and the recorder.

6 Claims, 9 Drawing Figures

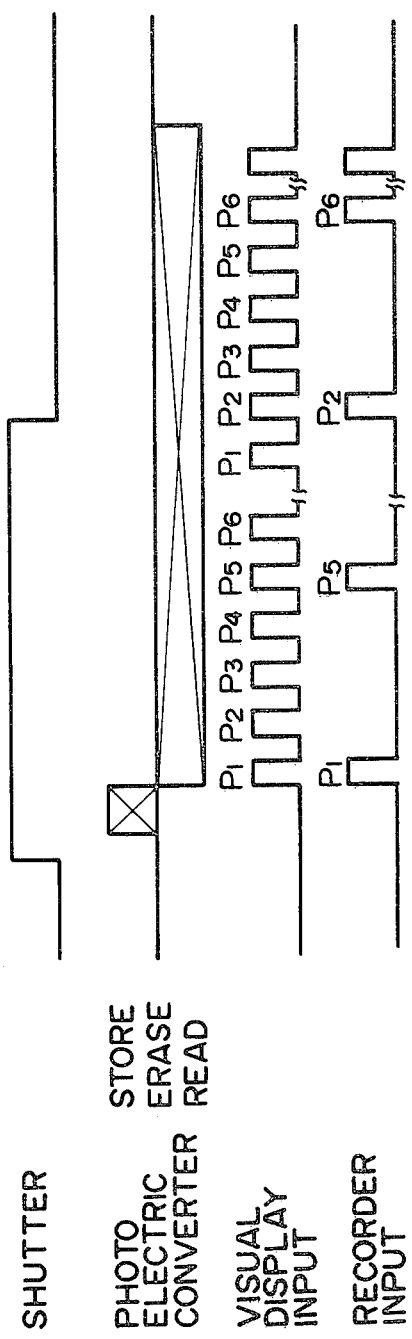

IMAGE STORAGE DEVICE

BACKGROUND OF THE INVENTION

1. Field of the Invention

The present invention relates to an image storage device for recording images through the use of a solid-state image sensor.

2. Description of the Prior Art

In conventional image storage devices employing a solid-state image sensor, a image signal obtained with the solid-state image sensor is once recorded on a magnetic tape, disc, drum or like magnetic recording medium. The image signal thus recorded is then transferred to a separate playback unit, from which it is applied to a TV receiver set or printer to produce thereon a visible image. It is important to arrange such an image storage device so that an image of a subject may be monitored during the image pickup operation or immediately thereafter. With such an arrangement, it is possible to check the image for a defect and to process each picture element data for improving its picture quality and other purposes as required.

In Japanese Published Unexamined Patent Application No. 136325/79 there is disclosed an image storage device which is capable of electronically recording an image of a subject and providing a visible display of the image on a visual display unit forming a part of the image storage device as well as recording the image on a recording medium.

FIG. 1 is a block diagram showing, by way of example, such a conventional image storage device provided with a visual display unit. The image storage device comprises a photoelectric converter 100 for receiving an optical input through an optical system, an A-D converter 101 for converting information from each picture element cell of the photoelectric conversion unit 100 into digital form, a buffer memory 102 for temporarily storing the digital signal, a D-A converter 103 for converting the digital signal from the buffer memory 102 into an analog signal, a visual display CTR 104 for receiving the analog image signal from the D-A converter 103 to visualize an image of a subject, a magnetic recorder 105 for recording the analog image signal from the D-A converter 103, and an exposure-readout controller 106 for regulating and controlling the abovesaid parts.

In FIG. 1, the photoelectric converter 100 is formed by CCD's, BBD's or the like and since they are of the destructive readout type, information of each picture element cell is once stored via the A-D converter 101 in the buffer memory 102 which is provided with storage areas having one-to-one correspondence to the picture element cells of the photoelectric converter 100. The buffer memory 102 is a circulating memory, which repeatedly sends out picture signals to the visual display CRT 104 via the D-A converter 103 and supplies picture information of one frame or cycle to the magnetic recorder 105.

As will be seen from the above, it is impossible in the prior art example to provide on the visual display unit a visual display of the image signal from the solid-state image sensor and to record it on the recording medium unless after the image signal is once loaded in an external large capacity buffer memory. Accordingly, the conventional image storage device requires a buffer memory of the capacity corresponding to the picture element cells and an A-D converter for loading signals in the buffer memory, and hence it has the defect of markedly complex circuit arrangement.

In addition, since the abovesaid prior art example is arranged so that a signal of the same speed as the image signal supplied to the visual display CRT 104 is also applied to the magnetic recorder 105, a highspeed magnetic recording system is required which has a sufficient accuracy for video-speed recording and magnetic recording is impossible with the use of, for example, an audio-grade magnetic recording mechanism.

SUMMARY OF THE INVENTION

It is therefore an object of the present invention to provide a simple-structured, inexpensive image storage device which does not involve the use of a large capacity buffer memory.

Another object of the present invention is to provide an image storage device which is capable of selectively or simultaneously performing visual display and recording of a image signal with a simple arrangement.

Yet another object of the present invention is to provide an inexpensive image storage device which permits recording of a image signal with a recorder of low-speed operation.

The abovesaid objective can be achieved by providing an image storage device which comprises a photoelectric converter having a plurality of a non-destructive readout picture element cells arranged in a predetermined form, a visual display unit supplied with storage information of each picture element cell of the photoelectric converter at a first scanning speed to produce a visible image, a recorder for recording a signal at a second scanning speed lower than the first scanning speed, and switching or branching means for supplying each of the visual display unit and the recorder with a signal read out from the photoelectric converter.

BRIEF DESCRIPTION OF THE DRAWINGS

FIG. 9 is a timing chart explanatory of the operation of the embodiment depicted in FIG. 8.

DESCRIPTION OF THE PREFERRED EMBODIMENTS

Figure 2:
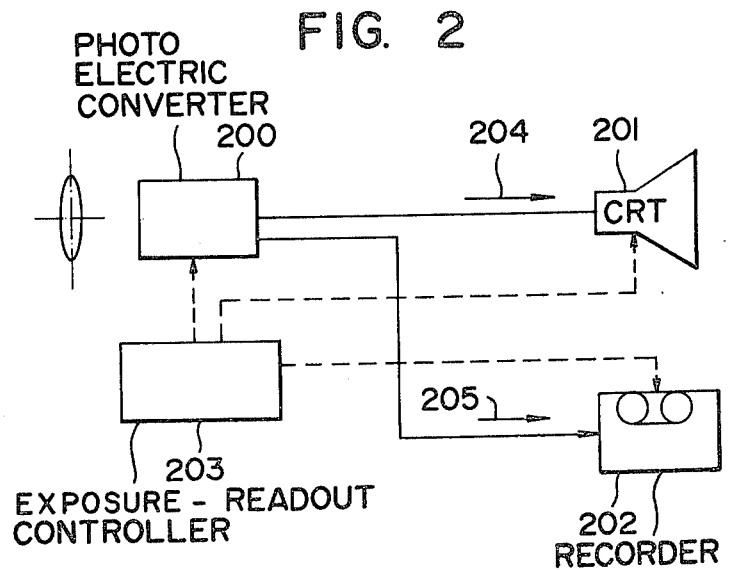
FIG. 2 is a block diagram illustrating the basic arrangement of the present invention.

FIG. 2 illustrates in block form the basic arrangement of the image storage device of the present invention which has the visual display and recording functions. Reference numeral 200 indicates a photoelectric converter; 201 designates a visual display unit; 202 identifies a recorder; 203 denotes an exposure-readout controller; and 204 and 205 represent first and second scanning speeds for supplying the visual display unit 201 and the recorder 202 with signals read out from the photoelectric converter 200.

The image storage device of the present invention is provided, as its basic constituent parts, with the photoelectric converter 200 having a plurality of nondestructive readout picture element cells arranged in two dimensions, for example, in a matrix form; the visual display unit 201 supplied with storage information of each picture element cell of the photoelectric converter 200 at the first scanning speed 204 to produce a visible image; the recorder 202 for recording a signal at the second scanning speed 205 lower than the first scanning speed 204; and switching means (the exposurereadout controller 203 in this embodiment) for supplying each of the visual display unit 201 and the recorder 202 with a signal read out from the photoelectric converter 200.

Figure 1:
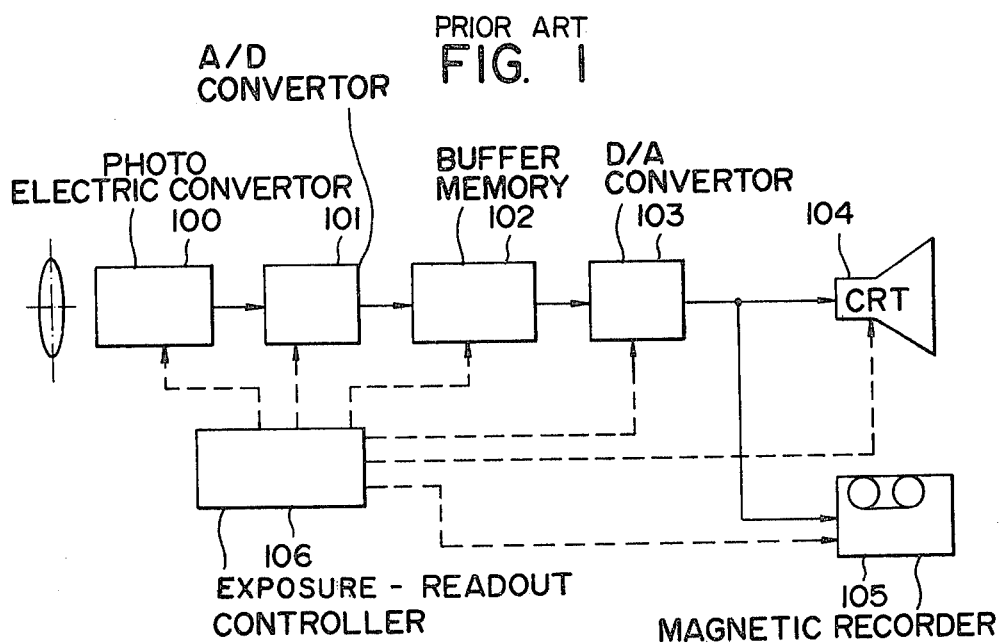
FIG. 1 is a block diagram showing a prior art example.

Since the photoelectric converter 200 is formed by the non-destructive readout picture element cells, its content is retained even if information of the same picture element cell is read out therefrom a plurality of times. Accordingly, even if information of each picture element cell is read out, for example, repeatedly for producing a visible image on the visual display unit 201 as described previously, there is not caused any trouble in subsequent readout of information of each picture element cell. Therefore, picture information stored in each picture element cell can be supplied to each of the visual display unit 201 and the recorder 202, so that in the case of recording the picture information from the photoelectric converter 200 concurrently with or after the visual display of the picture information, the A-D converter 101 and the buffer memory 102 in FIG. 1 are unnecessary and, in addition, since the readout of the picture element cells is non-destructive, the buffer memory and so forth used in FIG. 1 are not needed, permitting substantial simplification of the circuit arrangement.

Figure 3:
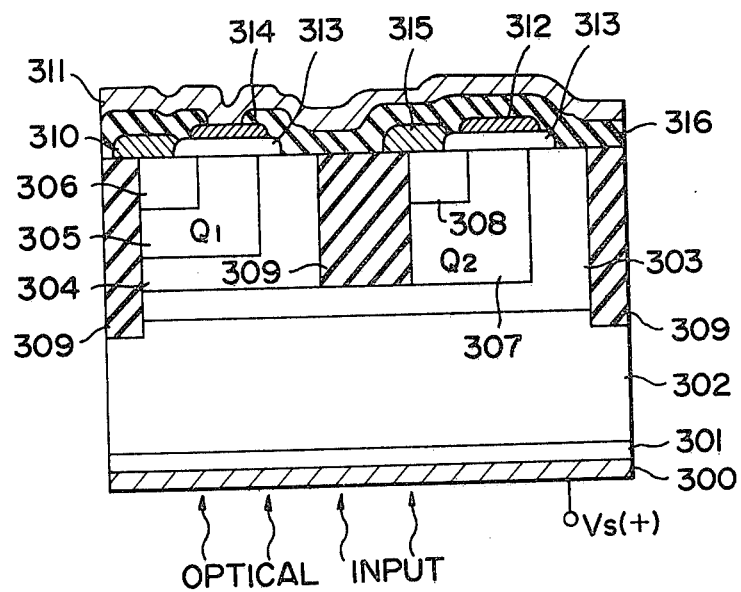
FIG. 3 is a sectional view illustrating, by way of example, a non-destructive readout picture element cell for use in the present invention.
Figure 4:
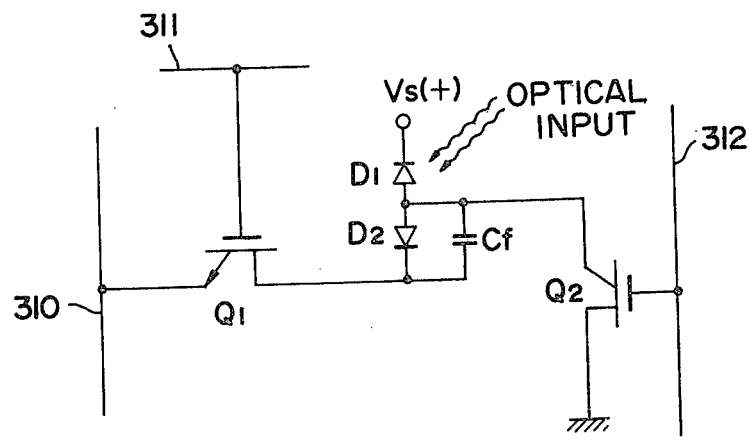
FIG. 4 is an equivalent circuit of the picture element cell shown in FIG. 3.

FIG. 3 shows in section a specific example of the non-destructive readout picture element cell for use in the present invention and FIG. 4 is an equivalent circuit diagram of the picture element cell. In FIGS. 3 and 4, reference numeral 300 indicates a transparent electrode biased to a power source voltage Vs(+); 301 designates an n+ region; 302 identifies a high resistivity region, for example, a p− region; 303 denotes a p+ region; 304 represents an n+ region; 305 shows a p region (a channel region); 306 refers to an n+ source region; 309 indicates an isolation region formed of an insulator; 310 designates a bit line; 311 identifies a word line; 312 denotes an erasing line; 313 represents a gate insulating film; 314 shows a gate electrode; 315 refers to a grounding electrode; 316 indicates an insulating layer; $Q_1$ designates a readout transistor; $Q_2$ identifies an erasing transistor; $D_1$ and $D_2$ denote diodes; and Cf represents a capacitance. The n+ region 301, the p− region 302, the p+ region 303 and the n+ region 304 form a hook structure. This hook structure is equivalently represented by a back-to-back connection of the diodes $D_1$ and $D_2$. The junction capacitance between the p+ region 303 and the n+ region 304 is represented by Cf. The n+ region 304, the p region 305 and the n+ region 306 correspond to the drain, gate and source of the readout transistor $Q_1$, respectively, and the p+ region 303, the n region 307 and the p$^{30}$ region 308 correspond to the drain, gate and source of the erasing transistor $Q_2$, respectively.

Upon application of an optical input to the picture element cell in which the predetermined voltage Vs(+) is applied to the transparent electrode 300 to deplete the p− region 302 throughout it so that carriers may travel therein at a saturated velocity, electron-hole pairs are generated in the p− region 302 in the vicinity of the n+ region 301. The electrons thus created are absorbed into the n+ region 301 but the holes are accelerated by an electric field and accumulated in the p+ region 303 to charge it positive. As a result of this, the barrier potential of the n+ region 304 for electrons drops, permitting electrons to flow out of the n+ region 304 into the p+ region 303 across the junction formed between the both regions held in the floating state. Thus, the n+ region 304 is biased positive.

The potential V(t) of the n+ region 304 is approximately given by the following expression relative to the light integration period of 0 to t sec:

$$V(t) = \frac{cq}{Cf} \int_0^t S(t)dt \tag{1}$$

where S(t) is the photon density, c is the velocity of light and q is the unit quantity of positive charges. Hence a voltage corresponding to the optical input is obtained.

Turning ON the readout transistor $Q_1$ through the word line 311, the potential on the bit line 310 varies with the voltage of the n+ region 304, so that the information of the picture element can be read out by detecting the voltage variation on the bit line. In this case, since the n+ region 304 and the p+ region 303 are both held in the floating state, the diffusion potential of the junction therebetween becomes equivalently low and, consequently, electrons having flowed into the n+ region 304 during the readout operation flow out therefrom towards the substrate across the p+ region 303. Accordingly, even after the readout transistor $Q_1$ is turned ON to read out the stored content, holes of optical information accumulated in the p+ region 303 can be retained, thus enabling non-destructive readout. The erasing transistor $Q_2$ is held in the OFF state during exposure and, after exposure, it is turned ON to erase the holes accumulated in the p+ region 303 in preparation for the next exposure.

The arrangement of the non-destructive readout picture element cell need not always be limited specifically to the above-described one but may also be such that employs the readout transistor $Q_1$ alone and inverts the polarity of the power source voltage Vs to make it a little negative during erasing. Also it is possible to obtain the same results as those described above by making reverse the polarities of all the semiconductor regions of the picture element cell and using a negative voltage as the power source voltage. In this case, the hook structure is formed by the p+ region 301, the high resistivity (n−, i or p−) region 302, the n+ region 303 and the p+ region 304. The conductivity types of the regions 306, 307 and 308 are also made reverse correspondingly.

More detailed arrangements and modified forms of such a non-destructive readout picture element cell are set forth in our prior U.S. patent application Ser. Nos. 254,046 and 265,383 and Japanese Pat. Appln. No. 60316/80. In the present invention, the non-destructive readout picture element cell can be employed regardless of whatever arrangement it may have.

Figure 5:
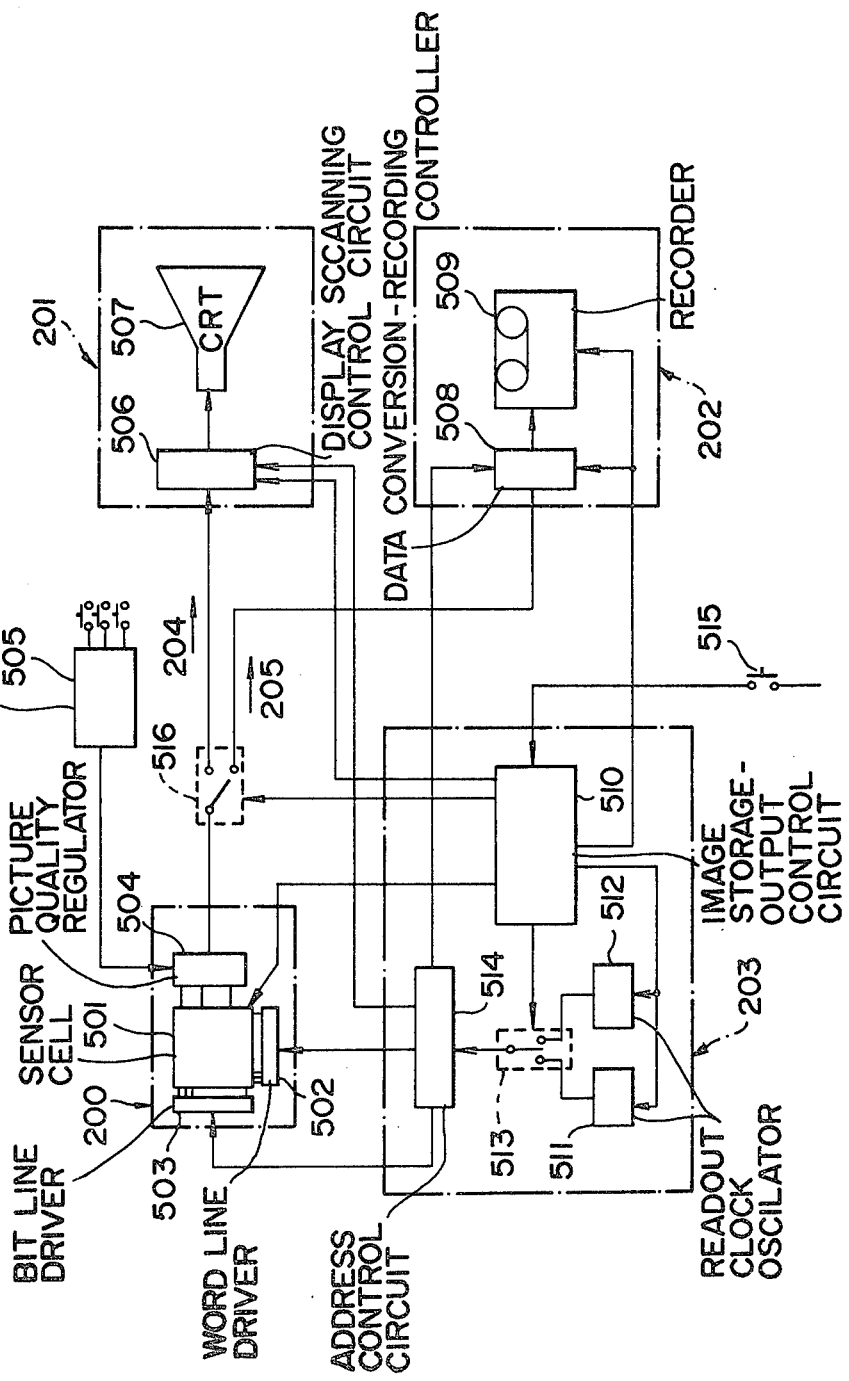
FIG. 5 is a block diagram illustrating an embodiment of the present invention.

FIG. 5 illustrates in block form an embodiment of the present invention in which a signal read out from the photoelectric converter 200 using the picture element cell of FIG. 3 as a basic picture element is supplied to each of the visual display unit 201 and the recorder 202. In FIG. 5, the parts corresponding to those in FIGS. 2, 3 and 4 are identified by the same reference numerals.

The photoelectric converter 200 comprises a sensor cell 501 having a plurality of such picture cells of FIG. 3 arranged in a matrix form, a word line driver 502, a bit line driver 503 and a picture quality regulator 504 which is provided as required. The word line driver 502, the bit line driver 503 and the application of the bias voltage Vs(+) shown in FIG. 3 are placed under the control of the exposure-readout controller 203. The picture quality regulator 504 is controlled by a manual picture quality controller 505 and performs a known convolution of the picture signal readout from the photoelectric converter 200 to provide for increased sharpness in the resulting picture or remove noise from the picture signal.

The visual display unit 201 comprises a scanning control circuit 506 for controlling the scanning of the signal read out from the photoelectric converter 200 and a display 507 such as a CRT. The scanning control circuit 506 is controlled by the exposure-readout controller 203 in the timing for scanning. The display 507 may be, for example, a cathode ray tube (CRT), a liquid crystal display tube, a CRT storage tube, electrochromium devices or storage type electroluminescence devices. In the case of the display having no storage function, such as a CRT, it is repeatedly supplied with signals from the photoelectric converter 200 at the rate of thirty times per second.

The recorder 202 comprises a data conversion-recording controller 508 and a recording device 509. The data conversion-recording controller 508 has the functions of FM modulation for analog recording of the image signal, A-D conversion for digital recording of the image signal, encoding and parallel-serial conversion, and the controller 508 is placed under the control of the exposure-readout controller 203. The recording device 509 is a magnetic tape, disc or drum. The present invention employs an audio-grade recorder which does not require a high-speed, high-precision mechanism.

The exposure-readout controller 203 comprises an image storage-output control circuit 510, a first read clock oscillator 511, a second clock oscillator 512 for generating a clock signal of a lower speed than a first clock signal by the first clock oscillator 511, a clock select switching element 513 and a readout address control circuit 514. The image storage-output control circuit 510 is supplied with an operating signal of an external shutter button 515 to select the first and second read clock oscillators 511 and 512 in a time series and activates the clock select switching element 516 for applying a selected clock signal to the read address control circuit 514 and, at the same time, the control circuit 510 activates a read line select switching element 516. By such operations of the control circuit 510, signals read out from the photoelectric converter 200 are supplied to the visual display unit 201 and the recorder 202 at the first scanning speed 204 and the lower second scanning speed 205, respectively.

The image storage-output control circuit 510 is electrically connected with the visual display unit 201, the recorder 202 and the read address control circuit 514 and provides a clock signal to each of them. Further, the control circuit 510 receives the operating signal of the shutter button 515 to control the ON-OFF of the voltage Vs(+) applied to the sensor 501, limiting the signal stored in the sensor cell 501 to a constant period of time. This stored signal control operation is to provide the shutter function of a camera by the application of the voltage Vs(+) to the sensor cell 501. Such a shutter function of the image storage-output control circuit 510 is not required when an optical shutter is used for controlling light incident for the sensor cell 501.

The read address control circuit 514 supplies each of the word line driver 502 and the bit line driver 503 of the photoelectric converter 200 with the clock signal selected by the clock select switching element 513 and also applies a synchronizing signal to each of the visual display unit 201 and the recorder 202.

Figure 6:
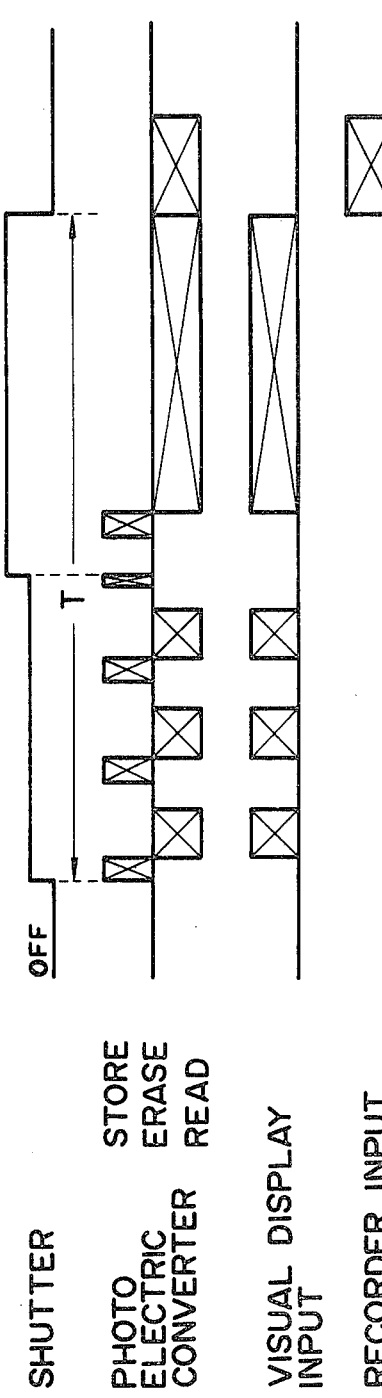
FIGS. 6 and 7 are timing charts explanatory of the operation of the embodiment shown in FIG. 5.

FIG. 6 is a timing chart showing the operation of the shutter button 515, the storage operation and the erase/readout operation of the sensor cell 501 of the photoelectric converter 200, the input to the visual display unit 201 and the input to the recorder 202 after depression of the shutter button 515. A description will be given, with reference to FIG. 6, of the operation of the device shown in FIG. 5.

Depressing the shutter button 515, which is driven by a two-step operation, in the period in which the photoelectric converter 200, the visual display unit 201 and the recorder 202 are all in the OFF state, the switching elements 513 and 516 are connected by the first-step operation (by which the shutter button is depressed half) to the first clock oscillator 511 and the visual display unit 201, respectively. In this case, the storage, readout and erasing (destructive readout) operations are repeatedly performed and the signals read out are repeatedly applied to the visual display unit 201 at the first scanning speed 204, displaying on the display 507 the picture signal to be recorded. The image thus displayed corresponds to a finder image which is produced on a finder of an ordinary camera.

Next, by the second-step operation of the shutter button 515, the sensor cell 501 starts storage of the picture signal to be photographed and continues the storing operation until a proper amount of signals is stored. Then the signals thus stored are repeatedly read out by the aforementioned non-destructive readout operation into the visual display unit 201 at the first scanning speed 204, providing an image display on the display 507. The image thus displayed is a monitored image of the photographed image. If necessary, the picture quality of the thus displayed image can be regulated for improvement of its sharpness or removal of noise by manually driving the picture quality contoller 505 to conduct a known convolution on the signal read out from the photoelectric converter 200. After confirming this on the display unit 201, the image signal is recorded.

Turning OFF the shutter button 515 after the lapse of a period T, the switching elements 513 and 516 are changed over to the second clock oscillator 512 and the recorder 202, respectively, permitting the signals stored in the sensor cell 501 to be provided to the recorder 202 at the second scanning speed 205 for recording.

In this way, in the period T the image signal is applied from the photoelectric converter 200 to the visual display unit 201 at the first scanning speed, for example, at the rate of 30 times per second which corresponds to the frame frequency of television. On the other hand, after the period T, the image signal is recorded at the second scanning speed 205 lower than the first one 204. Therefore, the visual display of the image signal can be followed by its recording which is effected by a simple-structured magnetic recorder which does not involve a high-speed mechanism, for example, an audio-grade magnetic recorder.

The destructive readout of the sensor cell in the first-step operation of the shutter button 515 may be performed, for example, by repeatedly activating the readout and erasing transistors $Q_1$ and $Q_2$ alternately with each other, but this may also be done by the storage and erasing operations alternately inverting the polarity of the voltage Vs(+) which is applied to the transparent electrode 200. In the latter case, the erasing transistor $Q_2$ need not always be provided. The picture element cell shown in FIG. 3 is subjected to the nondestructive readout while the stored charges remain in the floating region 303, but after erasing the charges, the picture element cell is subjected to the destructive readout. No particular means is specified therefor. Further, since the abovesaid destructive readout operation is essentially to equip the visual display unit with the finder function of the camera, the abovesaid operation can also be omitted by preparing an optical finder separately.

For recording a color picture by the device described above, a color filter is disposed opposite each light-sensitive cell of the sensor cell 501 of the photoelectric converter 200. An optical input is decomposed by the color filter into three primary color components, which are converted by the sensor cell into three kinds of color picture signals.

Moreover, stroboscopic multiple photographing can also be effected through the use of the above-described device. In the period of the second-step operation of the shutter button 515, the voltage Vs(+) is intermittently applied to the sensor cell 501 of the photoelectric converter 200 a plurality of times and the resulting picture information is stored, or a strobo light is fired intermittently while applying the voltage Vs(+) to the sensor cell 501 and the resulting picture information is stored. In this case, it is also possible to subject the output signal from the photoelectric converter 200 to proper picture quality regulation to suppress a large quantity of picture signal output of an overexposed area (an area of a stationary object in the case of stroboscopic photographing).

Figure 7:
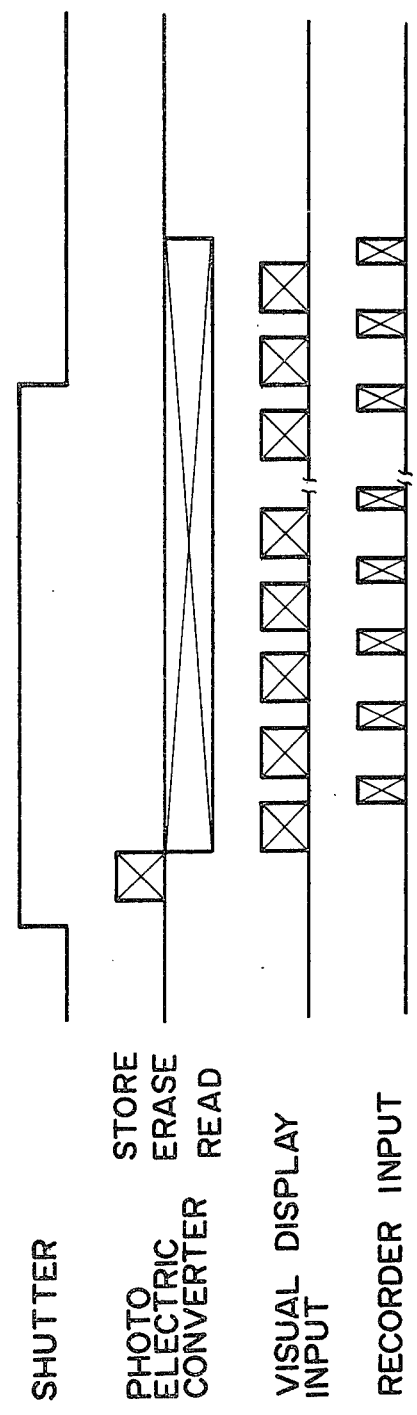

While in the foregoing the present invention has been described in connection with the case where the image signal is recorded by the recorder 202 after monitoring the image by the visual display unit 201, it is also possible in the device of FIG. 2 to perform recording concurrently with monitoring. FIG. 7 is a timing chart explanatory of the operation in such a case.

In FIG. 7, the image information stored in the sensor cell 501 of the photoelectric converter shown in FIG. 5 is read out non-destructively. In the case where the signal read out is a image signal which is applied to a television receiver set, the switching elements 513 and 516 are respectively connected to the first clock oscillator 511 and the visual display unit 201 in the period corresponding to the horizontal scanning period of television and, by the repetition of the horizontal scanning, an image is displayed on the visual display unit 201. After one horizontal scanning period, the switching elements 513 and 516 are charged over to record the image signal from a portion of the picture cell matrix of the sensor cell by the second clock within the horizontal blanking period and, thereafter, recording of each line is performed within each horizontal blanking period, thus recording all the image signals stored in the sensor cell matrix.

Figure 8:
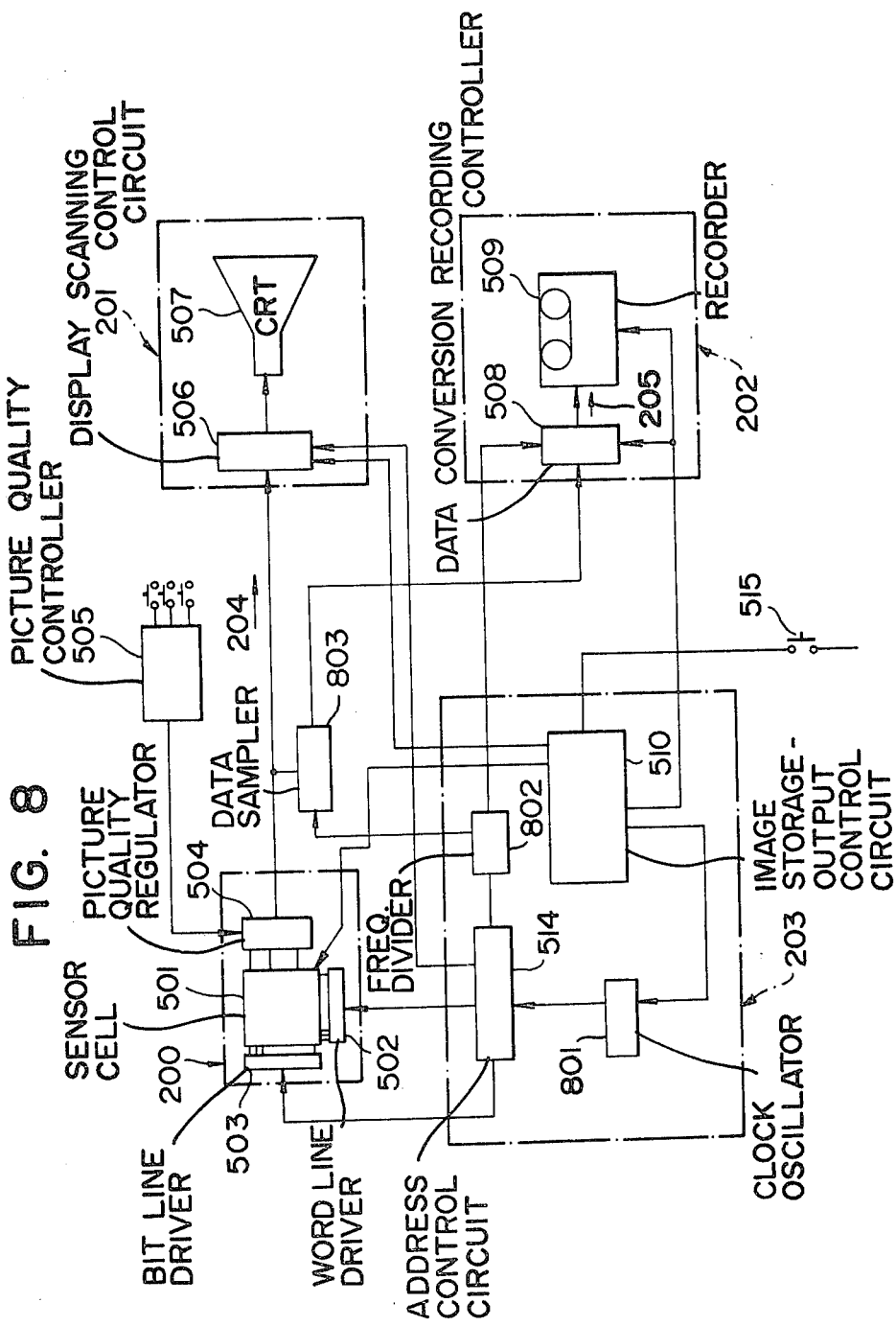
FIG. 8 is a block diagram illustrating another embodiment of the present invention.

FIGS. 8 and 9 are a block diagram of another embodiment of the present invention and a timing chart explanatory of its operation. The device of this embodiment differs from the device of FIG. 5 in that the first and second clock generators 511 and 512 and the clock select switching element 513 is replaced with a single clock oscillator 801 (similar to the first clock oscillator), and in that a data sampler 803 for selecting desired data from the signal applied to the visual display unit 201 and a frequency divider 802 for controlling the drive of the data sampler 803 are provided in place of the switch 516. The parts corresponding to those in FIG. 5 are identified by the same reference numerals.

As description will be given, with reference to FIG. 9, of the operation of this embodiment. Each image information or image information group ($P_1$, $P_2$, ... ) read out from the photoelectric converter 200 nondestructively are applied to the visual display unit 201 for display but a portion of the image information or image information group $P_1$, $P_5$, $P_2$ and $P_6$ are selectively provided to the recorder 202 via the frequency divider 802 and the data sampler 803. The information inputted to the recorder 202 is subjected to parallel-serial conversion by the data conversion/recording controller 508 and recorded by the recorder 509 or recorded without being converted. In this embodiment, the driving speed of the photoelectric converter 200 is not altered and the signal is applied to the recorder 202 at the lower second scanning speed in accordance with the ratio at which it is sampled by the data sampler 803 but it is also possible to further lower the scanning speed of the signal sent out after being subjected to the parallel-serial conversion by the data conversion/recording controller. The point is that the scanning speed of the signal to the recorder 509 must be sufficiently lower than the scanning speed of the signal to the visual display unit 201.

Accordingly, invention comprises a photoelectric converter 200 having an arrangement of a plurality of non-destructive read out picture element cells, each for producing a stored information signal, a visual display unit 201 for receiving a stored information signal from each cell at a first scanning speed to produce a visible image, a recorder 202 for recording the stored information signal of each cell at a second scanning speed which is lower than the first scanning speed, and switching means either in the form of switches 113, 115, 116 in FIG. 5 or in the form of switch 115 with frequency divider 802 and sampler 803 in FIG. 8, for supplying each of the visual display unit and the recorder with the stored information signal at the respective first and second scanning speeds.

As has been described in detail in the foregoing, according to the present invention, a visual display (monitoring) and recording of a image signal can be achieved using a simple arrangement without requiring a large capacity buffer memory and the visual display is performed at high speed but recording is effected at low speed. Accordingly, the recorder need not be high-speed and can be formed by, for example, an audiograde magnetic recording device. Moreover, it is possible to obtain a record of the best picture quality by processing a picture signal according to a monitored image or required and recording the processed signal after monitoring the resulting image again. Therefore, the present invention is of great utility when put to practical use.

It will be apparent that many modifications and variations may be effected without departing from the scope of the novel concepts of this invention.

What is claimed is:

1. An image storage device comprising:
   a photoelectric converter having an arrangement of a plurality of non-destructive readout picture element cells, each for producing a stored information signal which can be read out without destruction;
   a visual display unit for receiving a readout stored information signal of each picture element cell at a first scanning speed to produce a visible image;
   a recorder for recording a readout stored information signal of each picture, at a second scanning speed which is lower than the first scanning speed to record a visible image; and
   switching means connected to said photoelectric converter, said visual display unit and said recorder for supplying each of said visual display unit and said recorder with the readout stored information signal of each picture element cell, respectively, at said first and said second scanning speeds.

2. An image storage device according to claim 1 wherein said switching means includes a mechanism by which a scanning speed for reading out the stored information signal from each picture element cell of the photoelectric converter is changed over between said first and second scanning speeds.

3. An image storage device according to claim 2 wherein said switching means comprises an exposure readout controller including a first readout clock oscillator operating at the first scanning speed; a second readout clock oscillator operating at the second scanning speed, said mechanism including a clock selection switch connected to said first and second oscillators for selecting one of said oscillators for connection to said visual display unit and said recorder, and a further switch for connecting one of said visual display units and said recorder to said photoelectric converter at a time.

4. An image storage device according to claim 1 wherein said switching means comprises an exposure readout controller including a clock oscillator for supplying the first scanning speed, a frequency divider connected to said clock operator for supplying the second scanning speed, a first data line connected between said photoelectric converter and said visual display unit for carrying the stored information signal of each picture element cell, a sampler connected to said frequency divider, said data line and said recorder for supplying the stored information signal to said recorder at the second scanning speed while the stored information signal is supplied to said visual display unit at the first scanning speed.

5. An image device comprising:
   a photoelectric converter having an arrangement of a plurality of non-destructive readout picture element cells each for producing a stored information signal which can be read out without destruction;
   a visual display unit for receiving a readout stored information signal of each picture element cell at a first scanning speed to produce a visible image;
   a recorder for recording a further readout stored information signal of each picture element cell at a second scanning speed which is lower than the first scanning speed to record a visible image; and
   sampling means connected to said photoelectric converter, said visual display unit and said recorder for simultaneously supplying said visual display unit and said recorder with the readout stored information signal of each picture element cell.

6. An image storage device according to claim 5 wherein said sampling means includes a mechanism by which a scanning speed for reading out the stored information signal from each picture element cell of the photoelectric converter is changed over to the first and second scanning speeds.